(12) United States Patent
Chu et al.

(10) Patent No.: US 11,552,829 B2
(45) Date of Patent: Jan. 10, 2023

(54) METHOD AND SYSTEM FOR ADJUSTING LINE WIDTH AND LINE GAP OF DIFFERENTIAL SIGNAL PAIR

(71) Applicant: Universal Global Technology (Huizhou) Co., Ltd., Guangdong Province (CN)

(72) Inventors: Yen-Chih Chu, Guangdong Province (CN); Ming-Yu Cheng, Guangdong Province (CN)

(73) Assignee: Universal Global Technology (Huizhou) Co., Ltd., Guangdong Province (CN)

( * ) Notice: Subject to any disclaimer, the term of this patent is extended or adjusted under 35 U.S.C. 154(b) by 0 days.

(21) Appl. No.: 17/454,480

(22) Filed: Nov. 10, 2021

(65) Prior Publication Data
US 2022/0247602 A1     Aug. 4, 2022

(30) Foreign Application Priority Data
Feb. 2, 2021    (CN) .......................... 202110144132.1

(51) Int. Cl.
| | | |
|---|---|---|
| *H04L 25/02* | (2006.01) | |
| *H04B 3/32* | (2006.01) | |
| *H05K 1/02* | (2006.01) | |

(52) U.S. Cl.
CPC ........... *H04L 25/0272* (2013.01); *H04B 3/32* (2013.01); *H05K 1/0245* (2013.01)

(58) Field of Classification Search
CPC ..... H04L 25/0272; H04B 3/32; H05K 1/0245
See application file for complete search history.

(56) References Cited

U.S. PATENT DOCUMENTS

| | | | | |
|---|---|---|---|---|
| 2011/0019371 A1* | 1/2011 | Hsu | ....................... | H05K 1/0245 361/749 |
| 2014/0189631 A1* | 7/2014 | Sakata | ................... | G06F 30/394 716/129 |
| 2021/0392742 A1* | 12/2021 | Liou | ..................... | H05K 1/0245 |
| 2022/0344100 A1* | 10/2022 | Bouvier | ............... | H05K 1/0231 |

FOREIGN PATENT DOCUMENTS

| | | |
|---|---|---|
| CN | 111246658 A | 6/2020 |
| CN | 111447732 A | 7/2020 |

* cited by examiner

*Primary Examiner* — Dac V Ha
(74) *Attorney, Agent, or Firm* — CKC & Partners Co., LLC

(57) ABSTRACT

A method for adjusting a line width and a line gap of a differential signal pair includes performing a new parameter setting step, a distance difference of center calculating step, a reference polygon generating step and a differential signal pair adjusting step. The new parameter setting step is performed to set a new line width and a new line gap of the new differential signal line pair. The distance difference of center calculating step is performed to calculate a difference between an original center distance of the original differential signal line pair and a new center distance of the new differential signal line pair. The reference polygon generating step is performed to generate a reference polygon from an original center line of the original differential signal line pair. The differential signal pair adjusting step is performed to adjust the reference polygon to the new differential signal line pair.

10 Claims, 7 Drawing Sheets

METHOD AND SYSTEM FOR ADJUSTING LINE WIDTH AND LINE GAP OF DIFFERENTIAL SIGNAL PAIR

RELATED APPLICATIONS

This application claims priority to China Application Serial Number 202110144132.1, filed Feb. 2, 2021, which is herein incorporated by reference.

BACKGROUND

Technical Field

The present disclosure relates to a method and a system for adjusting a line width and a line gap. More particularly, the present disclosure relates to a method and a system for adjusting a line width and a line gap of a differential signal pair.

Description of Related Art

When the stacking of the printed circuit board changes, a line width and a line gap of the circuit should be adjusted at the same time. However, the conventional drawing tools can only adjust the line width and the line gap of the differential signal line pair manually or adjust the differential signal line pair in a specific angle.

Thus, developing a method and a system for adjusting a line width and a line gap of a differential signal pair are commercially desirable.

SUMMARY

According to one aspect of the present disclosure, a method for adjusting a line width and a line gap of a differential signal pair is configured to adjust an original line width and an original line gap of an original differential signal line pair to generate a new differential signal line pair. The method for adjusting the line width and the line gap of the differential signal pair includes performing a new parameter setting step, a distance difference of center calculating step, a reference polygon generating step and a differential signal pair adjusting step. The new parameter setting step is performed to set a new line width and a new line gap of the new differential signal line pair via a user interface. The distance difference of center calculating step is performed to drive a processing unit to calculate a difference between an original center distance of the original differential signal line pair and a new center distance of the new differential signal line pair. The original center distance is equal to a sum of the original line width and the original line gap, and the new center distance is equal to a sum of the new line width and the new line gap. The reference polygon generating step is performed to drive the processing unit to generate a reference polygon from an original center line of the original differential signal line pair, wherein the reference polygon has a reference line width. The differential signal pair adjusting step is performed to drive the processing unit to adjust the reference polygon to the new differential signal line pair according to a judging rule. The reference line width is equal to the difference between the original center distance of the original differential signal line pair and the new center distance of the new differential signal line pair.

According to another aspect of the present disclosure, a system for adjusting a line width and a line gap of a differential signal pair is configured to adjust an original line width and an original line gap of an original differential signal line pair to generate a new differential signal line pair. The system for adjusting the line width and the line gap of the differential signal pair includes a memory unit, a user interface and a processing unit. The memory unit is configured to assess the original differential signal line pair, the new differential signal line pair and a judging rule. The user interface is configured to set a new line width and a new line gap of the new differential signal line pair. The processing unit is electrically connected to the memory unit and the user interface. The processing unit is configured to implement a method for adjusting the line width and the line gap of the differential signal pair includes performing a distance difference of center calculating step, a reference polygon generating step and a differential signal pair adjusting step. The distance difference of center calculating step is performed to calculate a difference between an original center distance of the original differential signal line pair and a new center distance of the new differential signal line pair. The original center distance is equal to a sum of the original line width and the original line gap, and the new center distance is equal to a sum of the new line width and the new line gap. The reference polygon generating step is performed to generate a reference polygon from an original center line of the original differential signal line pair. The reference polygon has a reference line width. The differential signal pair adjusting step is performed to adjust the reference polygon to the new differential signal line pair according to the judging rule. The reference line width is equal to the difference between the original center distance of the original differential signal line pair and the new center distance of the new differential signal line pair.

BRIEF DESCRIPTION OF THE DRAWINGS

The present disclosure can be more fully understood by reading the following detailed description of the embodiment, with reference made to the accompanying drawings as follows.

DETAILED DESCRIPTION

The embodiment will be described with the drawings. For clarity, some practical details will be described below.

However, it should be noted that the present disclosure should not be limited by the practical details, that is, in some embodiment, the practical details is unnecessary. In addition, for simplifying the drawings, some conventional structures and elements will be simply illustrated, and repeated elements may be represented by the same labels.

It will be understood that when an element (or device) is referred to as be "connected to" another element, it can be directly connected to the other element, or it can be indirectly connected to the other element, that is, intervening elements may be present. In contrast, when an element is referred to as be "directly connected to" another element, there are no intervening elements present. In addition, the terms first, second, third, etc. are used herein to describe various elements or components, these elements or components should not be limited by these terms. Consequently, a first element or component discussed below could be termed a second element or component.

Figure 1:
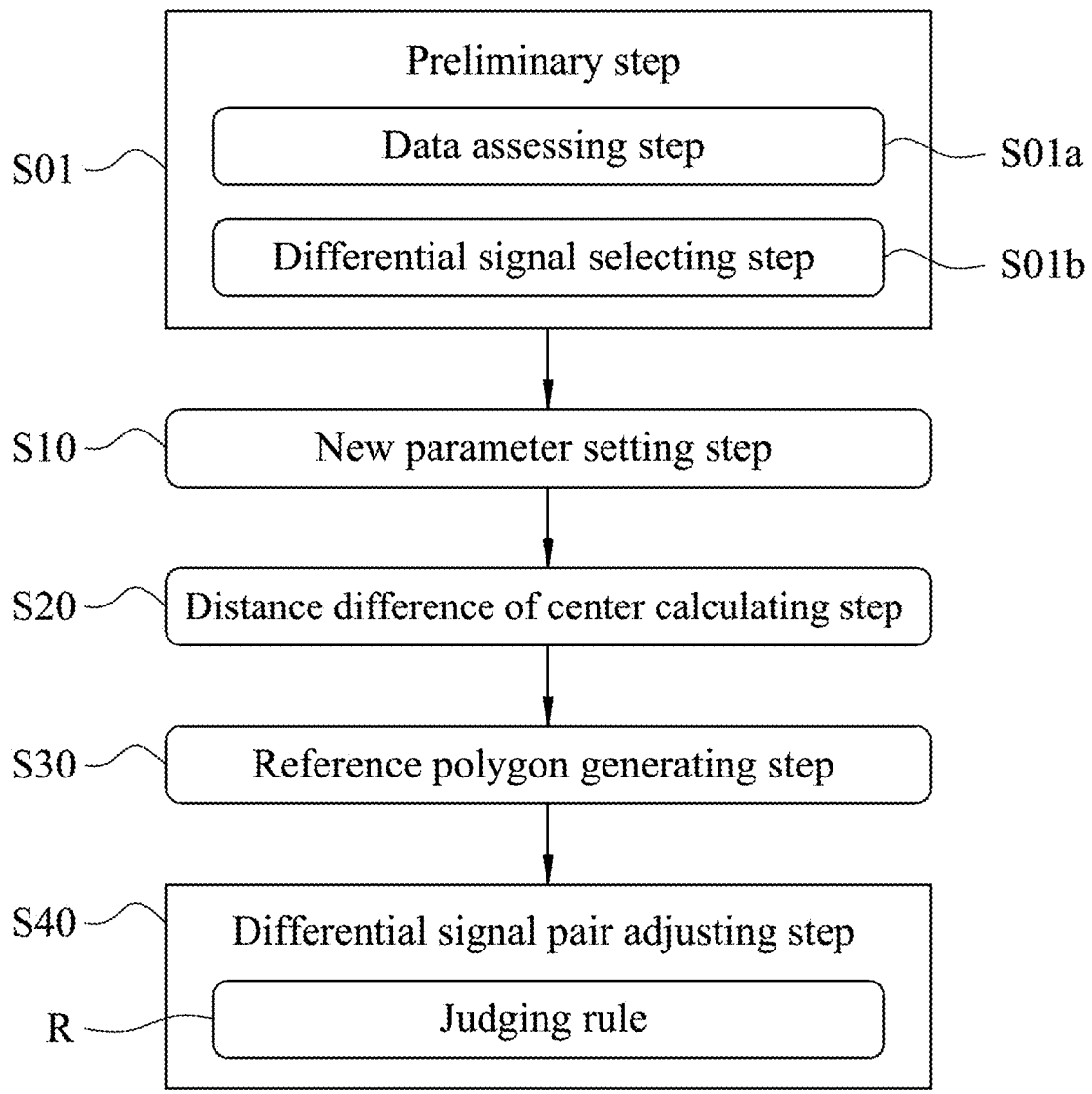
FIG. 1 shows a flow chart of a method for adjusting a line width and a line gap of a differential signal pair according to a first embodiment of the present disclosure.
Figure 2:
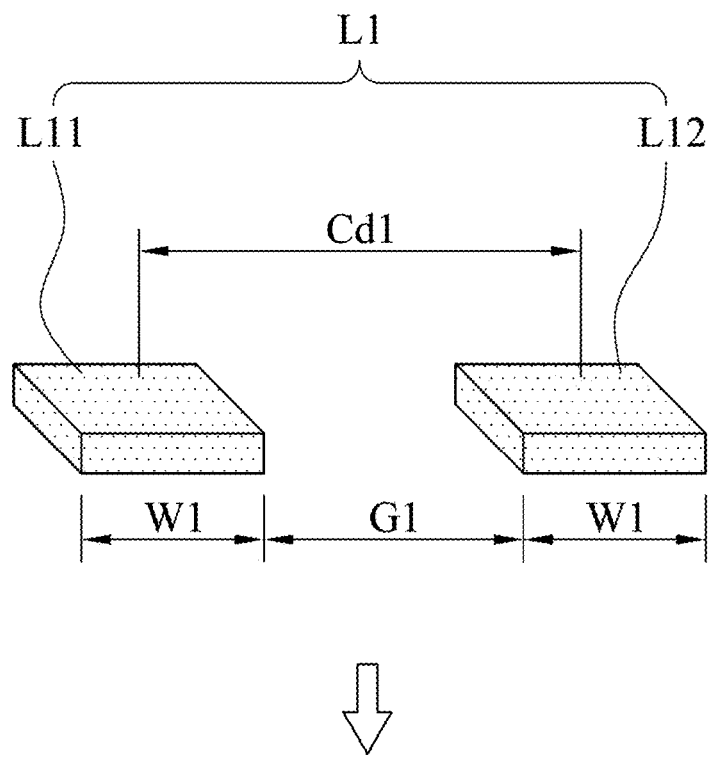
FIG. 2 shows a schematic view of an original differential signal line pair and a new differential signal line pair of the method for adjusting the line width and the line gap of the differential signal pair according to the first embodiment of the present disclosure.
Figure 2:
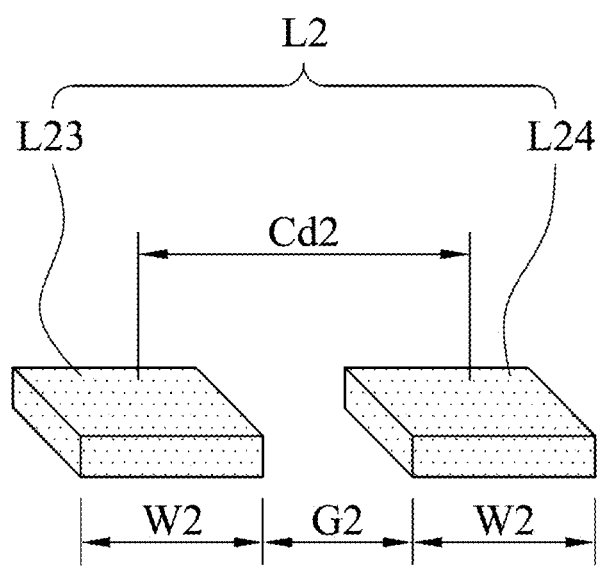

Please refer to FIG. 1 and FIG. 2. FIG. 1 shows a flow chart of a method 100 for adjusting a line width and a line gap of a differential signal pair according to a first embodiment of the present disclosure. FIG. 2 shows a schematic view of an original differential signal line pair L1 and a new differential signal line pair L2 of the method 100 for adjusting the line width and the line gap of the differential signal pair according to the first embodiment of the present disclosure. The method 100 for adjusting the line width and the line gap of the differential signal pair is configured to adjust an original line width W1 and an original line gap G1 of the original differential signal line pair L1 to generate the new differential signal line pair L2. The method 100 for adjusting the line width and the line gap of the differential signal pair includes performing a preliminary step S01, a new parameter setting step S10, a distance difference of center calculating step S20, a reference polygon generating step S30 and a differential signal pair adjusting step S40.

The preliminary step S01 includes a data assessing step S01a and a differential signal selecting step S01b. The data assessing step S01a is performed to drive a processing unit to assess a circuit from a memory unit. The differential signal selecting step S01b is performed to select the original differential signal line pair L1 of the circuit via a user interface. In other words, the data assessing step S01a assess the complete circuit, that is, a data of the printed circuit board (PCB). The circuit includes the original differential signal line pair L1. The differential signal selecting step S01b is performed to select the original differential signal line pair L1 with the line width and the line gap need to be revised in the PCB.

The new parameter setting step S10 is performed to set a new line width W2 and a new line gap G2 of the new differential signal line pair L2 via the user interface.

The distance difference of center calculating step S20 is performed to drive the processing unit to calculate a difference between an original center distance Cd1 of the original differential signal line pair L1 and a new center distance Cd2 of the new differential signal line pair L2. In detail, the original differential signal line pair L1 includes a first differential signal line L11 and a second differential signal line L12. The new differential signal line pair L2 includes a third differential signal line L23 and a fourth differential signal line L24. A distance between an original center line C1 (in FIG. 3) of the first differential signal line L11 and another original center line C1 of the second differential signal line L12 is the original center distance Cd1. A distance between the new center line C2 (in FIG. 3) of the third differential signal line L23 and another new center line C2 of the fourth differential signal line L24 is the new center distance Cd2. Because the differential signal pair is two signals with the same amplitude and the opposite phase, the differential signal line pair on the PCB is two signal lines with the same width and the same length which are disposed on the same layer. Therefore, the original center distance Cd1 is equal to a sum of the original line width W1 and the original line gap G1. The new center distance Cd2 is equal to a sum of the new line width W2 and the new line gap G2.

The reference polygon generating step S30 is performed to drive the processing unit to generate a reference polygon (not shown) from the original center line C1 of the original differential signal line pair L1. The reference polygon has a reference line width. The reference line width is equal to the difference between the original center distance Cd1 of the original differential signal line pair L1 and the new center distance Cd2 of the new differential signal line pair L2. The differential signal pair adjusting step S40 is performed to drive the processing unit to adjust the reference polygon to the new differential signal line pair L2 according to a judging rule R. The judging rule R is configured to judge a difference between the original center distance Cd1 and the new center distance Cd2. The judging rule R corresponding to different conditions will be described below by the corresponded schematic view of the structure of each of the steps.

Figure 3:
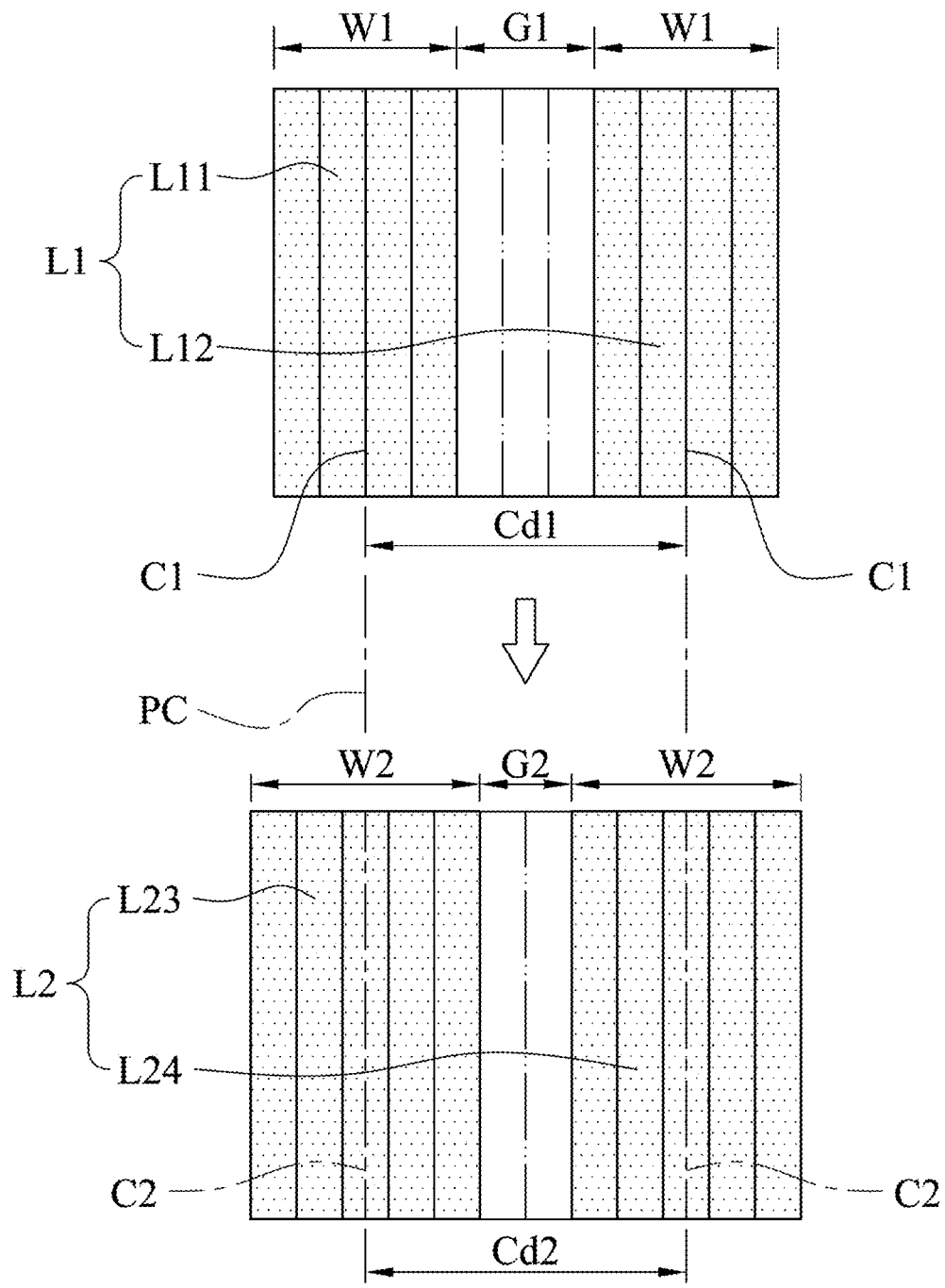
FIG. 3 shows a schematic view of a reference polygon generating step and a differential signal pair adjusting step of the method for adjusting the line width and the line gap of the differential signal pair of FIG. 1.

Please refer to FIG. 1 and FIG. 3. FIG. 3 shows a schematic view of the reference polygon generating step S30 and the differential signal pair adjusting step S40 of the method 100 for adjusting the line width and the line gap of the differential signal pair of FIG. 1. The judging rule R includes in response to determining that the original center distance Cd1 is equal to the new center distance Cd2, a reference center line PC of the reference polygon P is regarded as a new center line C2 of the new differential signal line pair L2 to generate the new differential signal line pair L2. In FIG. 3, the original line width W1 of the original differential signal line pair L1 is 4; the original line gap G1 is 3; the new line width W2 of the new differential signal line pair L2 is 5; the new line gap G2 is 2; the original center distance Cd1 is 7; the new center distance Cd2 is 7, and the original center distance Cd1 is equal to the new center distance Cd2. The reference line width of the reference polygon P generated by the reference polygon generating step S30 is 0. The differential signal pair adjusting step S40 regards the reference center line PC of the reference polygon P as a new center line C2 of the new differential signal line pair L2 according to the judging rule R, and extends a half of the new line width W2 of the new differential signal line pair L2 from the new center line C2 symmetrically.

Figure 4:
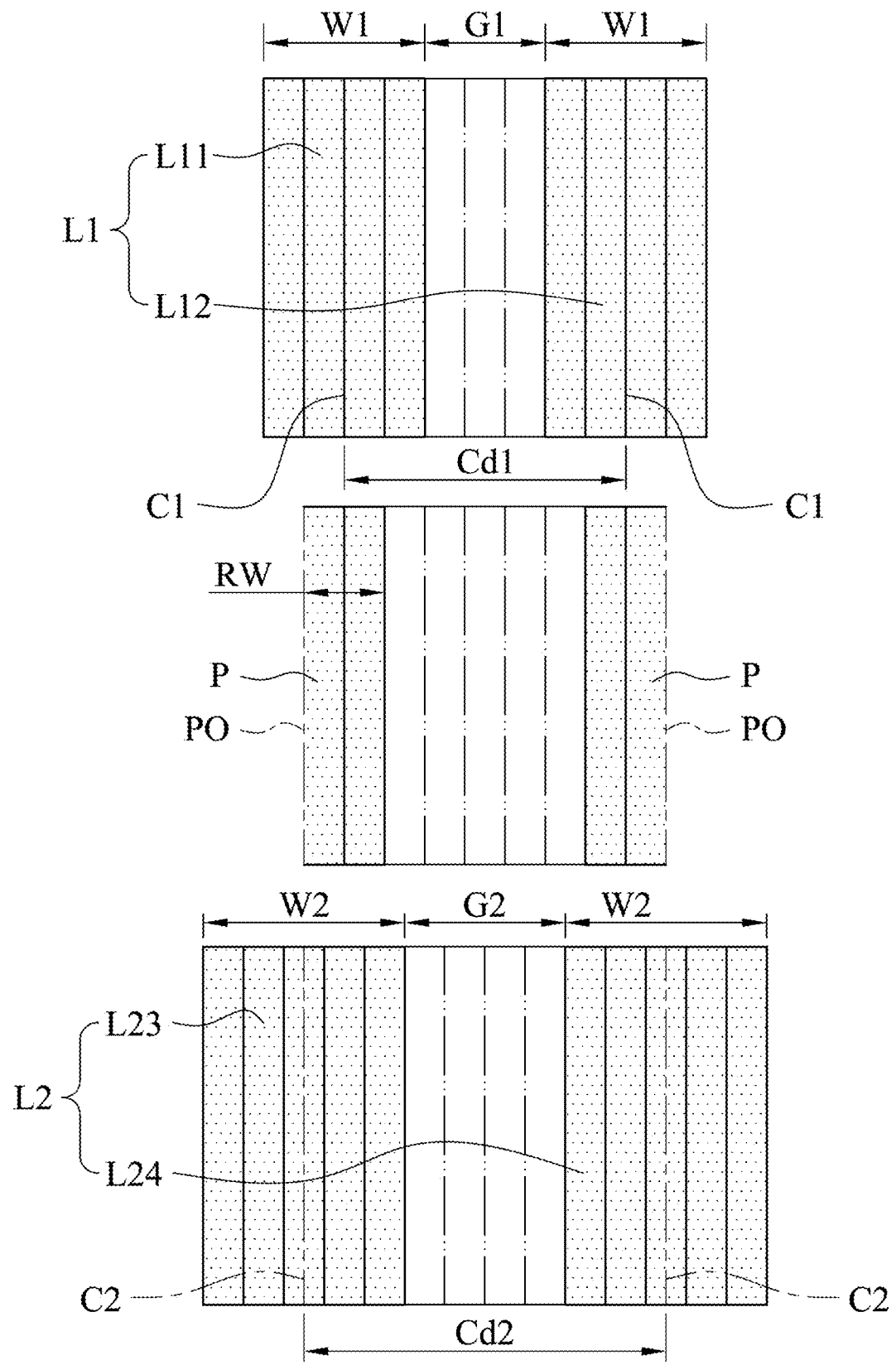
FIG. 4 shows another schematic view of the reference polygon generating step and the differential signal pair adjusting step of the method for adjusting the line width and the line gap of the differential signal pair of FIG. 1.

Please refer to FIG. 1 and FIG. 4. FIG. 4 shows another schematic view of the reference polygon generating step S30 and the differential signal pair adjusting step S40 of the method 100 for adjusting the line width and the line gap of the differential signal pair of FIG. 1. The judging rule R further includes in response to determining that the original center distance Cd1 is shorter than the new center distance Cd2, an outer edge PO of the reference polygon P is regarded as a new center line C2 of the new differential signal line pair L2 to generate the new differential signal line pair L2. In FIG. 4, the original line width W1 of the original differential signal line pair L1 is 4; the original line gap G1 is 3; the new line width W2 of the new differential signal line pair L2 is 5; the new line gap G2 is 4; the original center distance Cd1 is 7; the new center distance Cd2 is 9, and the original center distance Cd1 is shorter than the new center distance Cd2. The reference line width RW of the reference polygon P generated by the reference polygon generating step S30 is 2. The differential signal pair adjusting step S40 regards the outer edge PO of the reference polygon P as a new center line C2 of the new differential signal line pair L2 according to the judging rule R, and extends a half of the new line width W2 of the new differential signal line pair L2 from the new center line C2 symmetrically.

Figure 5:
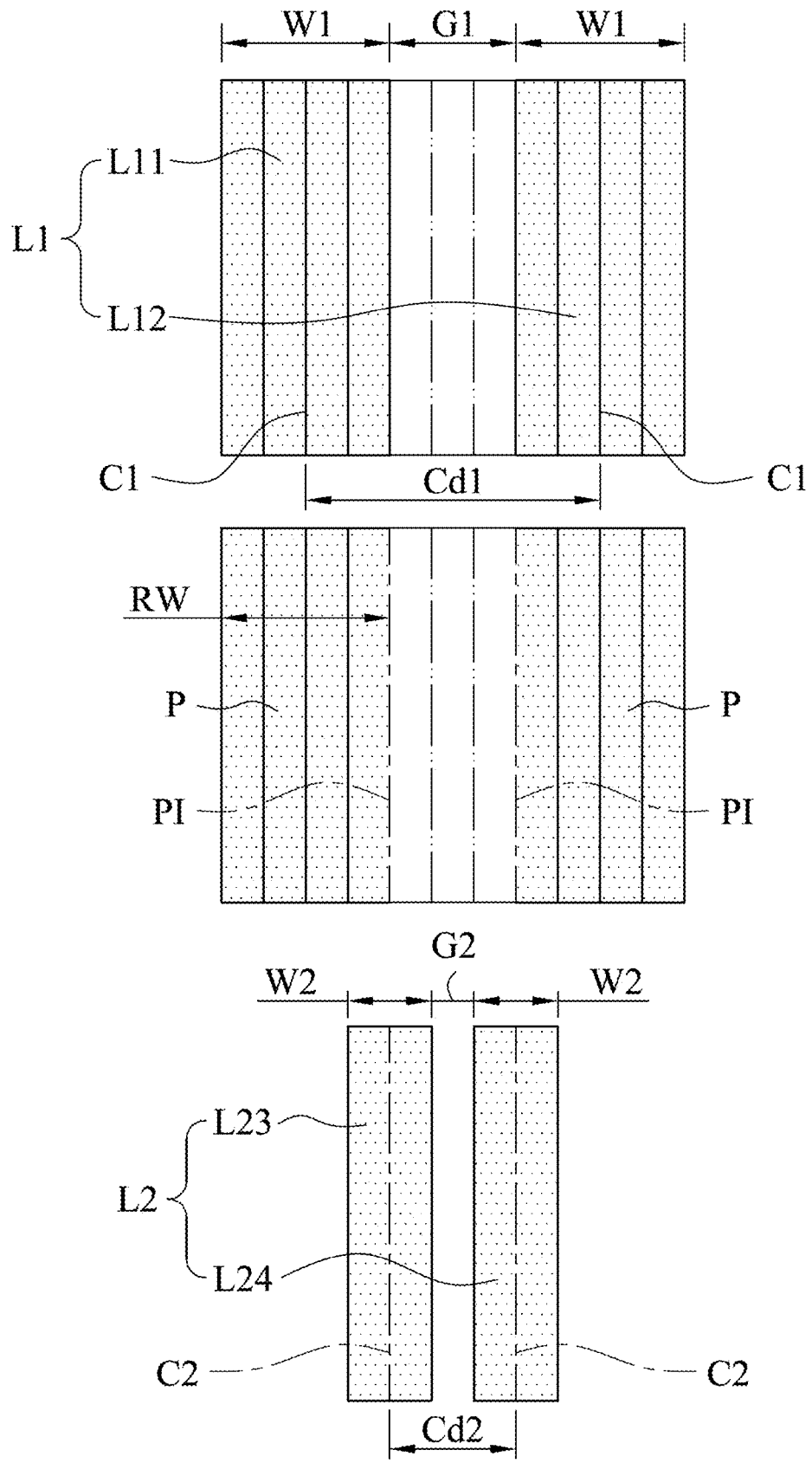
FIG. 5 shows further another schematic view of the reference polygon generating step and the differential signal pair adjusting step of the method for adjusting the line width and the line gap of the differential signal pair of FIG. 1.

Please refer to FIG. 1 and FIG. 5. FIG. 5 shows further another schematic view of the reference polygon generating step S30 and the differential signal pair adjusting step S40 of the method 100 for adjusting the line width and the line gap of the differential signal pair of FIG. 1. The judging rule R further includes in response to determining that the original center distance Cd1 is greater than the new center distance Cd2, an inner edge PI of the reference polygon P is regarded as a new center line C2 of the new differential signal line pair L2 to generate the new differential signal line pair L2. In FIG. 5, the original line width W1 of the original differential signal line pair L1 is 4; the original line gap G1 is 3; the new line width W2 of the new differential signal line pair L2 is 2; the new line gap G2 is 1; the original center distance Cd1 is 7; the new center distance Cd2 is 3, and the original center distance Cd1 is greater than the new center distance Cd2. The reference line width RW of the reference polygon P generated by the reference polygon generating step S30 is 4. The differential signal pair adjusting step S40 regards the inner edge PI of the reference polygon P as a new center line C2 of the new differential signal line pair L2 according to the judging rule R, and extends a half of the new line width W2 of the new differential signal line pair L2 from the new center line C2 symmetrically.

Therefore, the method 100 for adjusting the line width and the line gap of the differential signal pair of the present disclosure can adjust the original line width W1 and the original line gap G1 of the whole original differential signal line pair L1, which includes different angles, into the new differential signal line pair L2 automatically, instead of adjusting only one of the original line width W1 and the original line gap G1 of the original differential signal line pair L1.

Figure 6:
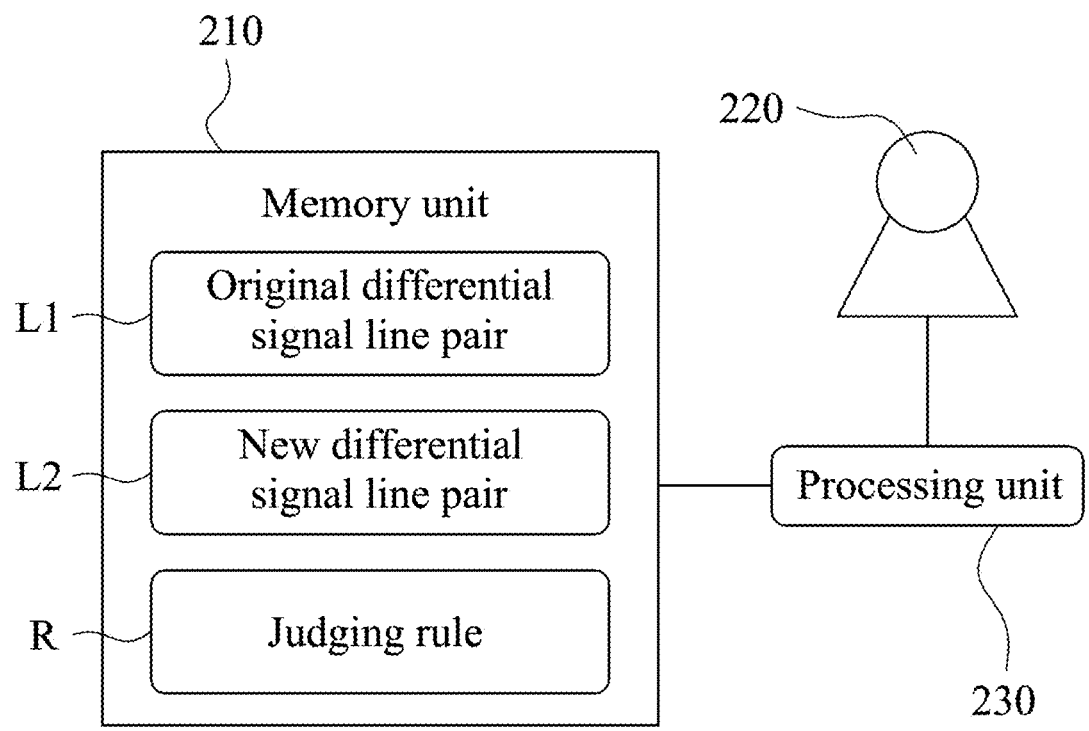
FIG. 6 shows a block diagram of a system for adjusting a line width and a line gap of a differential signal pair according to a second embodiment of the present disclosure.

Please refer to FIG. 1 to FIG. 6. FIG. 6 shows a block diagram of a system 200 for adjusting a line width and a line gap of a differential signal pair according to a second embodiment of the present disclosure. The system 200 for adjusting the line width and the line gap of the differential signal pair includes a memory unit 210, a user interface 220 and a processing unit 230. The memory unit 210 is configured to assess an original differential signal line pair L1, a new differential signal line pair L2 and a judging rule R. The user interface 220 is configured to set a new line width W2 and a new line gap G2 of the new differential signal line pair L2. The processing unit 230 is electrically connected to the memory unit 210 and the user interface 220. The processing unit 230 is configured to implement the method 100 for adjusting the line width and the line gap of the differential signal pair of FIG. 1. In detail, the memory unit 210 can be a memory, a register or other data assessing element; the user interface 220 can be a web page or an operation interface of an application; the processing unit 230 can be a microprocessor or a central processing unit, but the present disclosure is not limited thereto.

Figure 7:
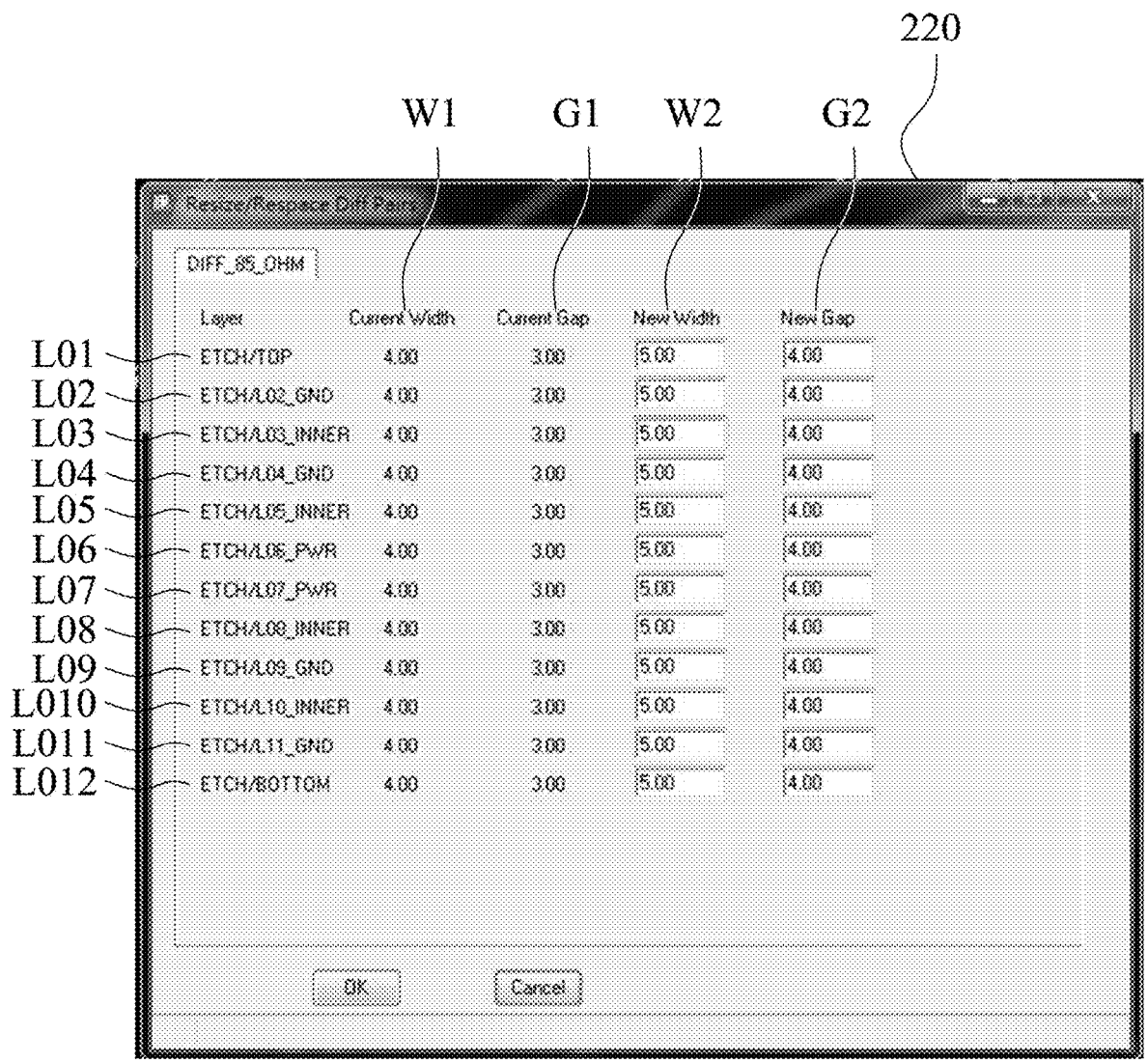
FIG. 7 shows a schematic view of a user interface of FIG. 6.

Please refer to FIG. 7. FIG. 7 shows a schematic view of the user interface 220 of FIG. 6. "Layer" represents a number of the layer of the circuit on the PCB; "Current Width" represents the original line width W1; "Current Gap" represents the original line gap G1; "New Width" represents the new line width W2; "New Gap" represents the new line gap G2. In FIG. 7, the system 200 for adjusting the line width and the line gap of the differential signal pair of the present disclosure can adjust the original differential signal line pairs L01, L02, L03, L04, L05, L06, L07, L08, L09, L010, L011, L012 in the first layer to the twelfth layer of the circuit to generate the new differential signal line pairs (not shown) at the same time.

Thus, the system 200 for adjusting the line width and the line gap of the differential signal pair of the present disclosure can save the time of adjusting the differential signal line pair by adjusting all the original differential signal line pairs L01-L012 at the same time.

In other embodiment of the present disclosure, the system for adjusting the line width and the line gap of the differential signal pair of the present disclosure can also adjust differential signal line pair of a cross net (Xnet).

According to the aforementioned embodiments and examples, the advantages of the present disclosure are described as follows.

1. The method for adjusting the line width and the line gap of the differential signal pair of the present disclosure can adjust the original line width and the original line gap of the whole original differential signal line pair which includes different angles into the new differential signal line pair automatically, instead of adjusting only one of the original line width and the original line gap of the original differential signal line pair.

2. The system for adjusting the line width and the line gap of the differential signal pair of the present disclosure can save the time of adjusting the differential signal pair by adjusting all the original differential signal line pairs at the same time.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method for adjusting a line width and a line gap of a differential signal pair, which is configured to adjust an original line width and an original line gap of an original differential signal line pair to generate a new differential signal line pair, the method for adjusting the line width and the line gap of the differential signal pair comprising:
  performing a new parameter setting step to set a new line width and a new line gap of the new differential signal line pair via a user interface;
  performing a distance difference of center calculating step to drive a processing unit to calculate a difference between an original center distance of the original differential signal line pair and a new center distance of the new differential signal line pair, wherein the original center distance is equal to a sum of the original line width and the original line gap, and the new center distance is equal to a sum of the new line width and the new line gap;
  performing a reference polygon generating step to drive the processing unit to generate a reference polygon from an original center line of the original differential signal line pair, wherein the reference polygon has a reference line width; and performing a differential signal pair adjusting step to drive the processing unit to adjust the reference polygon to the new differential signal line pair according to a judging rule;

wherein the reference line width is equal to the difference between the original center distance of the original differential signal line pair and the new center distance of the new differential signal line pair.

2. The method for adjusting the line width and the line gap of the differential signal pair of claim 1, wherein the judging rule comprises:

in response to determining that the original center distance is equal to the new center distance, a reference center line of the reference polygon is regarded as a new center line of the new differential signal line pair to generate the new differential signal line pair.

3. The method for adjusting the line width and the line gap of the differential signal pair of claim 1, wherein the judging rule comprises:

in response to determining that the original center distance is shorter than the new center distance, an outer edge of the reference polygon is regarded as a new center line of the new differential signal line pair to generate the new differential signal line pair.

4. The method for adjusting the line width and the line gap of the differential signal pair of claim 1, wherein the judging rule comprises:

in response to determining that the original center distance is greater than the new center distance, an inner edge of the reference polygon is regarded as a new center line of the new differential signal line pair to generate the new differential signal line pair.

5. The method for adjusting the line width and the line gap of the differential signal pair of claim 1, further comprising:

performing a preliminary step comprising:
 performing a data assessing step to drive the processing unit to assess a circuit from a memory unit, wherein the circuit comprises the original differential signal line pair; and
 performing a differential signal selecting step to select the original differential signal line pair of the circuit via the user interface.

6. The method for adjusting the line width and the line gap of the differential signal pair of claim 2, wherein, the original differential signal line pair comprises a first differential signal line and a second differential signal line, and a distance between the original center line of the first differential signal line and another original center line of the second differential signal line is the original center distance; and the new differential signal line pair comprises a third differential signal line and a fourth differential signal line, and a distance between the new center line of the third differential signal line and another new center line of the fourth differential signal line is the new center distance.

7. A system for adjusting a line width and a line gap of a differential signal pair, which is configured to adjust an original line width and an original line gap of an original differential signal line pair to generate a new differential signal line pair, the system for adjusting the line width and the line gap of the differential signal pair comprising:

a memory unit configured to assess the original differential signal line pair, the new differential signal line pair and a judging rule;

a user interface configured to set a new line width and a new line gap of the new differential signal line pair; and a processing unit electrically connected to the memory unit and the user interface, wherein the processing unit is configured to implement a method for adjusting the line width and the line gap of the differential signal pair comprising:

performing a distance difference of center calculating step to calculate a difference between an original center distance of the original differential signal line pair and a new center distance of the new differential signal line pair, wherein the original center distance is equal to a sum of the original line width and the original line gap, and the new center distance is equal to a sum of the new line width and the new line gap;

performing a reference polygon generating step to generate a reference polygon from an original center line of the original differential signal line pair, wherein the reference polygon has a reference line width; and performing a differential signal pair adjusting step to adjust the reference polygon to the new differential signal line pair according to the judging rule;

wherein the reference line width is equal to the difference between the original center distance of the original differential signal line pair and the new center distance of the new differential signal line pair.

8. The system for adjusting the line width and the line gap of the differential signal pair of claim 7, wherein the judging rule comprises:

in response to determining that the original center distance is equal to the new center distance, a reference center line of the reference polygon is regarded as a new center line of the new differential signal line pair to generate the new differential signal line pair;

in response to determining that the original center distance is shorter than the new center distance, an outer edge of the reference polygon is regarded as the new center line of the new differential signal line pair to generate the new differential signal line pair; and in response to determining that the original center distance is greater than the new center distance, an inner edge of the reference polygon is regarded as the new center line of the new differential signal line pair to generate the new differential signal line pair.

9. The system for adjusting the line width and the line gap of the differential signal pair of claim 7, wherein the processing unit is configured to implement a preliminary step, the preliminary step comprises:

performing a data assessing step to assess a circuit from the memory unit, wherein the circuit comprises the original differential signal line pair; and performing a differential signal selecting step to select the original differential signal line pair of the circuit via the user interface.

10. The system for adjusting the line width and the line gap of the differential signal pair of claim 8, wherein, the original differential signal line pair comprises a first differential signal line and a second differential signal line, and a distance between the original center line of the first differential signal line and another original center line of the second differential signal line is the original center distance; and the new differential signal line pair comprises a third differential signal line and a fourth differential signal line, and a distance between the new center line of the third differential signal line and another new center line of the fourth differential signal line is the new center distance.

\* \* \* \* \*